United States Patent
Numata

(10) Patent No.: US 6,201,416 B1
(45) Date of Patent: Mar. 13, 2001

(54) FIELD EFFECT TRANSISTOR LOGIC CIRCUIT WITH REDUCED POWER CONSUMPTION

(75) Inventor: Keiichi Numata, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/276,327

(22) Filed: Mar. 25, 1999

(30) Foreign Application Priority Data

Mar. 25, 1998 (JP) .................................................. 10-076374
Aug. 28, 1998 (JP) .................................................. 10-243300

(51) Int. Cl.[7] .................... H03K 19/084; H03K 19/0175
(52) U.S. Cl. ............................................. 326/107; 326/87
(58) Field of Search ................................. 326/87, 86, 83, 326/62, 82, 112, 119, 120

(56) References Cited

U.S. PATENT DOCUMENTS

| | | | |
|---|---|---|---|
| 4,450,369 | * 5/1984 | Schuermeyer | 326/116 |
| 4,707,622 | * 11/1987 | Takao et al. | 326/117 |
| 4,743,782 | * 5/1988 | Nelson et al. | 326/73 |
| 4,810,969 | * 3/1989 | Fulkerson | 326/116 |
| 4,937,474 | * 6/1990 | Sitch | 326/117 |
| 5,204,553 | * 4/1993 | Kataoka et al. | 326/83 |
| 5,323,071 | * 6/1994 | Hirayama | 326/68 |
| 5,374,862 | * 12/1994 | Takano | 326/112 |

FOREIGN PATENT DOCUMENTS

| | | |
|---|---|---|
| 1222484 | 9/1989 | (JP) . |
| 4-72914 | 3/1992 | (JP) . |
| 5227012 | 9/1993 | (JP) . |
| 08204542 | 8/1996 | (JP) . |
| 09261038 | 10/1997 | (JP) . |

OTHER PUBLICATIONS

Ultra High Sped Compound Semiconductor Device—Supervised by S. Sugano—Published by Baifukan K.K. on Nov. 30, 1986.
Mark N. Horenstein, Microelectronic Circuits and Devices, pp. 729–738, 1990.*

* cited by examiner

Primary Examiner—Michael Tokar
Assistant Examiner—James H. Cho
(74) Attorney, Agent, or Firm—Ostrolenk, Faber, Gerb & Soffen, LLP

(57) ABSTRACT

There is disclosed a field effect transistor logic circuit having an output terminal to be connected to a gate of an input field effect transistor in a next stage field effect transistor logic circuit. The field effect transistor logic circuit includes a depletion transistor having a drain connected to a first power supply voltage, an enhancement transistor having a drain connected at a node in common to a gate and a source of the depletion transistor. A gate of the enhancement transistor is connected to an input terminal, and a source of the enhancement transistor is connected to a second power supply voltage which is lower than the first power supply voltage. A high level potential limiting circuit is connected between the node and the output terminal, to lower a potential of the output terminal to a level which turns on a drain-source channel of the input field effect transistor of the next stage field effect transistor logic circuit but which never turns on a gate-source of the input field effect transistor of the next stage field effect transistor logic circuit, when the potential of the node is at a high level. A lower level lowering circuit having an input connected to the input terminal, is also connected between the output terminal and the second power supply voltage, for pulling down the potential of the output terminal to the potential of the second power supply voltage when the potential on the node is at a low level.

10 Claims, 6 Drawing Sheets

FIELD EFFECT TRANSISTOR LOGIC CIRCUIT WITH REDUCED POWER CONSUMPTION

BACKGROUND OF THE INVENTION

1. Field of the Invention

The present invention relates to a logic circuit, and more specifically to a field effect transistor (FET) logic circuit.

2. Description of Related Art

In the prior art, a fundamental circuit called a direct coupled FET logic (abbreviated to "DCFL") is widely known as a low power consumption logic circuit. This circuit is explained in many publications including FIG. 7.16 on Page 251 in "Ultra High Speed Compound Semiconductor Device", supervised by S. Sugano, published by Baitukan K. K., Nov. 30, 1986.

Referring to FIG. 1, there is shown a circuit diagram of one example of a DCFL circuit in the prior art. As shown in FIG. 1, the shown DCFL circuit is an inverter which includes a depletion compound semiconductor MES (metal-semiconductor) FET 1 having a drain connected to a first power supply terminal 31 ($V_{DD}$) and a gate and a source connected in common at a node 41 to a drain of an enhancement compound semiconductor MES FET 2. A gate of this enhancement FET 2 is connected to a second power supply terminal 32 (namely, a ground voltage $V_{SS}$). The node 41 is connected to an output terminal 22. In this DCFL circuit, the enhancement FET 2 operates as a switching device, and the depletion FET 1 operates as a load.

With this arrangement, if a low level is applied to the input terminal 21, the enhancement FET 2 is turned off, so that the potential of the output terminal 22 elevates to the power supply voltage $V_{DD}$. On the other hand, if a high level is applied to the input terminal 21, the enhancement FET 2 is turned on, so that the potential of the output terminal 22 drops. At this time, the output potential of the output terminal 22 is determined by a current capability of the depletion FET 1 and a current capability of the enhancement FET 2. In any case, the output potential of the output terminal 22 never drops to the potential $V_{SS}$ given by the second power supply terminal 32.

Incidentally, Japanese Patent Application Pre-examination Publication Nos. JP-A-01-222484 and JP-A-09-261038 (an English abstract of these Japanese patent publications are available and the content of those English abstracts are incorporated by reference in its entirety into this application) disclose different DCFL circuits. As described in these Japanese patent publications and the above referred literature, it is known that the power consumption of the logic circuit can be reduced by using the DCFL circuit.

In the above mentioned prior art circuit, the high level output potential reaches the power supply voltage $V_{DD}$. Therefore, considering that the output terminal 22 is connected to a gate of an input enhancement MES FET (not shown) of a next stage logic circuit (not shown), the high level output potential exceeds a potential which turns on a gate-source of the input enhancements MES FET of the next stage logic circuit, with the result that a current flows from the output terminal through the gate of the input enhancement MES FET of the next stage logic circuit to the source of the input enhancement MES FET of the next stage logic circuit. This gate potential for turning on the gate-source of the MES FET will be called a gate turn-on voltage in this specification, and is higher than a gate potential of the MES FET for turning on the MES FET, namely for turning a drain-source channel of the MES FET. Because of this, in the prior art circuit, when the power supply voltage is greater than the gate turn-on voltage of the MES FET, the power consumption becomes large in the high level outputting condition.

In addition, in the above mentioned prior art circuit, the low level of the output voltage never drops to the potential of the second power supply voltage (ground), but becomes on the order of plus several 100 mV. At this time, since the threshold of an enhancement FET is at a similar level, the input enhancement FET of the next stage logic circuit cannot be put in a complete OFF condition. Namely, in the next stage logic circuit, a current flows through a drain-source channel of the input enhancement FET, with the result that the consumed current resultantly increases. In other words, in this prior art circuit, when the low level is outputted, the next stage input enhancement FET is not put in the complete OFF condition, so that the power consumption becomes increased.

The above mentioned problems cannot be overcome even by technologies disclosed in the above referred Japanese patent publications

SUMMARY OF THE INVENTION

Accordingly, it is an object of the present invention to provide a field effect transistor logic circuit which has overcome the above mentioned problems of the prior art.

Another object of the present invention is to provide a field effect transistor logic circuit having a reduced power consumption.

The above and other objects of the present invention are achieved in accordance with the present invention by a field effect transistor logic circuit having an output terminal to be connected to a gate of an input field effect transistor in a next stage field effect transistor logic circuit, the field effect transistor logic circuit including a depletion transistor having a drain connected to a first power supply voltage, an enhancement transistor having a drain connected at a node to a source of the depletion transistor, a gate of the enhancement transistor being connected to an input terminal, a source of the enhancement transistor being connected to a second power supply voltage which is lower than the first power supply voltage, and a high level potential limiting circuit connected between the node and the output terminal, for lowering a potential of the output terminal to a level which turns on a drain-source channel of the input field effect transistor of the next stage field effect transistor logic circuit but which never turns on a gate-source of the input field effect transistor of the next stage field effect transistor logic circuit, when the potential on the node is at a high level.

Further, according to the present invention, a lower level lowering circuit connected to the output terminal for pulling down the potential of the output terminal to the potential of the second power supply voltage when the potential on the node is at a low level, is provided in place of the high level potential limiting circuit or in addition to the high level potential limiting circuit.

With the above arrangement, by action of the high level potential limiting circuit, the high level potential on the output terminal is elevated only to the potential which never turns on the gate-source of the input FET of the next stage field effect transistor logic circuit. Therefore, no current flows into the next stage field effect transistor logic circuit, so that a current non-contributable to the operation is minimized, and therefore, the power consumption is minimized. On the other hand, when the low level is outputted, the high level potential limiting circuit is put in an OFF condition, namely, in an inoperable condition, and the lower level lowering circuit is put in an ON condition, namely, in an operating condition, so that the low level potential on the output terminal is pulled down to the second power supply voltage, with the result that the input transistor of the next stage field effect transistor logic circuit is put in a complete OFF condition. Accordingly, the current flowing through the input transistor of the next stage field effect transistor logic circuit in the OFF condition can be prevented, so that the power consumption can be minimized.

The above and other objects, features and advantages of the present invention will be apparent from the following description of preferred embodiments of the invention with reference to the accompanying drawings.

DESCRIPTION OF THE PREFERRED EMBODIMENTS

Figure 1:
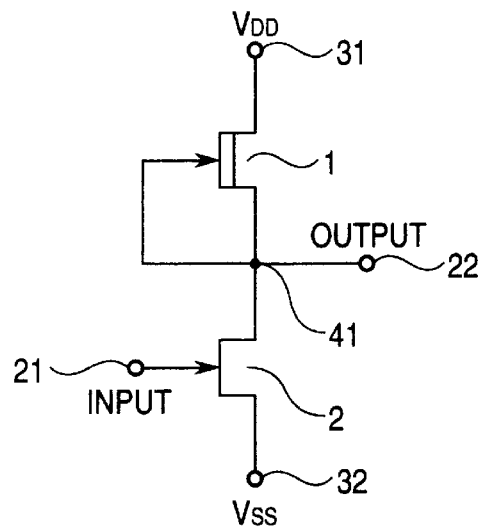
FIG. 1 is a circuit diagram of one example of a DCFL circuit in the prior art.
Figure 2:
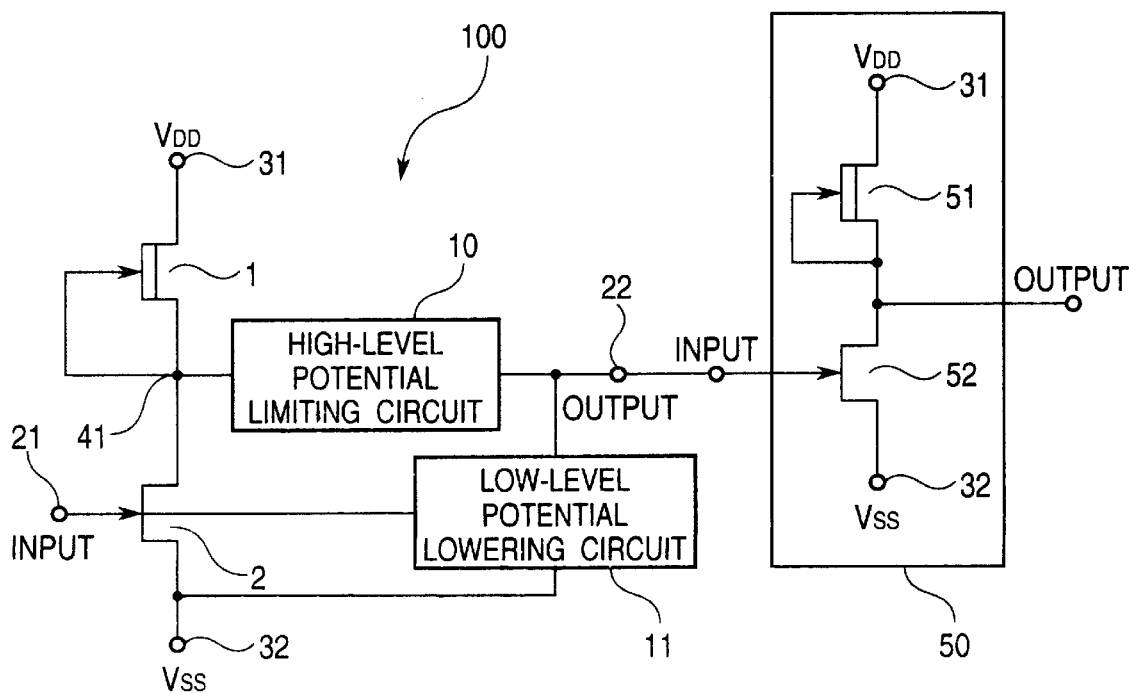
FIG. 2 is a block diagram illustrating a first conceptual embodiment of the logic circuit in accordance with the present invention.

Referring to FIG. 2, there is shown a block diagram illustrating a first conceptual embodiment of the logic circuit in accordance with the present invention. In FIG. 2 and succeeding figures, elements corresponding to those shown in FIG. 1 are given the same reference numerals, and a detailed explanation thereof will be omitted for simplification of the description.

As shown in FIG. 2, the logic circuit in accordance with the present invention is generally designated with reference numeral 100. In this logic circuit, the drain of the depletion FET 1 is connected to the first power supply terminal 31 (for example $V_{DD}$), and the gate and the source of the depletion FET 1 is connected in common at the node 41 to the drain of the enhancement FET 2. The gate of this enhancement FET 2 is connected to the input terminal 21, and the source of the enhancement FET 2 is connected to the second power supply terminal 32 (for example, $V_{SS}$). The node 41 is elevated to the power supply voltage $V_{DD}$ when it is at a high level.

This node 41 is connected to the output terminal 22 through a high level output potential limiting circuit 10 which acts to lower the high level potential on the output terminal 22, to a potential which is enough to turn on a drain-source channel of an input MES FET of a next stage logic circuit, having a gate connected to the output terminal 22 (for example, an input MES FET 52 of a next stage field effect transistor logic circuit 50) but which is insufficient to turn on a gate-source of the same input MES FET of the next stage logic circuit. Furthermore, a low level potential lowering circuit 11 having an input connected to the input terminal 21, is connected between the output terminal 22 and the second power supply terminal 32, for quickly and sufficiently pulling down the potential of the output terminal 22 to the potential of the second power supply terminal 32 when the output potential becomes a low level.

Incidentally, the next stage field effect transistor logic circuit 50 includes for example the above mentioned input FET 52, which is an enhancement MES FET, having a gate connected through an input terminal INPUT to the output terminal 22 of the preceding stage logic circuit 100, a source connected to the second power supply terminal 32 (for example, $V_{SS}$), and a drain connected to a gate and a source of a load FET 51 having a drain connected to the first power supply terminal 31 (for example, $V_{DD}$). A connection node between the FETs 51 and 52 is connected to an output terminal OUTPUT.

The above mentioned logic circuit 100 operates as a well known inverter. Now, an operation of the logic circuit 100 will be described.

When a low level is inputted to the input terminal 21, the enhancement FET 2 is turned off, so that the potential of the node 41 is elevated to the power supply voltage $V_{DD}$. At this time, the potential of the output terminal 22 is also elevated. However, by action of the high level output potential limiting circuit 10, after the potential of the output terminal 22 is elevated to a limited high level potential which is enough to turn on the drain-source channel of the input MES FET 52 of the next stage logic circuit 50 but which is insufficient to turn on the gate-source of the input MES FET 52 of the next stage logic circuit 50, the potential of the output terminal 22 no longer elevates higher than the limited high level potential. Therefore, when the high level is outputted from the logic circuit 100, no current flows into the stage circuit 50.

When a high level is inputted to the input terminal 21, the enhancement FET 2 is turned on, so that the potential of the node 41 falls down to several 100 mV. Therefore, the high level output potential limiting circuit 10 is put in an OFF condition, namely, in an inoperable condition. On the other hand, by action of the low level potential lowering circuit 11 operating in response to the high level inputted to the input terminal 21, the potential of the output terminal 22 is quickly pulled down to the same potential as that of the second power supply terminal 32 ($V_{SS}$). Therefore, the input transistor 52 of the next stage circuit 50 is put in a complete OFF condition, so that the current of the next stage circuit 50 in the OFF condition can be minimized.

As mentioned above, in this logic circuit in accordance with the first conceptual embodiment of the present invention, not only when the output is at the high level but also when the output is at the low level, a wasteful current non-contributable to the operation in minimized. Therefore, a low power consumption logic circuit can be realized. In this conception, if at least one of the high level output potential limiting circuit 10 and the low level potential lowering circuit 11 is provided, the power consumption can be reduced. Particularly, if the low level potential lowering circuit 11 is provided, it is possible not only to realize the low power consumption but also to shorten the transition time from the high level to the low level of the output (namely, to quicken the falling-down of the output).

Figure 3:
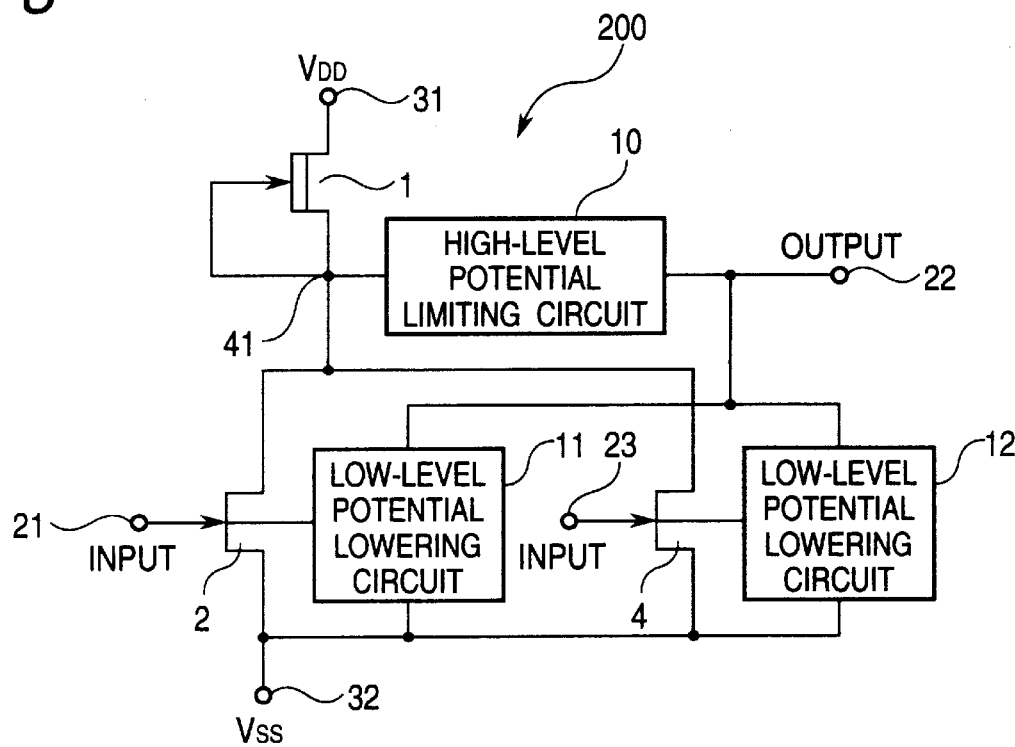
FIG. 3 is a block diagram illustrating a second conceptual embodiment of the logic circuit in accordance with the present invention.

Referring to FIG. 3, there is shown a block diagram illustrating a second conceptual embodiment of the logic circuit in accordance with the present invention. In FIG. 3 and succeeding figures, a next stage logic circuit connected to the output of the logic circuit in accordance with the present invention will be omitted for simplification of drawing, since one typical example of the next stage logic circuit is already shown in FIG. 2.

As shown in FIG. 3, the logic circuit in accordance with the present invention is generally designated with reference numeral 200. In this logic circuit, the drain of the depletion FET 1 is connected to the first power supply terminal 31 (for example, $V_{DD}$), and the gate and the source of the depletion FET 1 is connected in common at the node 41 to the drain of the enhancement FET 2 and a drain of another enhancement FET 4. The gate of the enhancement FET 2 is connected to the input terminal 21, and the source of the enhancement FET 2 is connected to the second power supply terminal 32 (for example, $V_{SS}$). A gate of the enhancement FET 4 is connected to another input terminal 23, and a source of the enhancement FET 4 is connected to the second power supply terminal 32 (for example, $V_{SS}$).

The node 41, is elevated to the power supply voltage $V_{DD}$ when it is at a high level. This node 41 is connected to the output terminal 22 through the high level output potential limiting circuit 10 which acts to lower the high level potential on the output terminal 22, to a potential which is enough to turn on a drain-source channel of an input MES FET (not shown in FIG. 3) of a next stage logic circuit (not shown in FIG. 3) having a gate connected to the output terminal 22 but which is insufficient to turn on a gate-source of the same input MES FET of the next stage logic circuit.

Furthermore, to the output terminal 22 the low level potential lowering circuit 11 having the input connected to the input terminal 21 is connected between the output terminal 22 and the second power supply terminal 32, for quickly and sufficiently pulling down the potential of the output terminal 22 to the potential of the second power terminal 32 when the output potential changes from the high level to the low level. Another low level potential lowering circuit 12 is connected between the output terminal 22 and the second power supply terminal 32. This low level potential lowering circuit 12 has an input connected to the second input terminal 23, and acts to quickly and sufficiently pull down the potential of the output terminal 22 to the potential of the second power supply terminal 32 when the output potential changes from the high level to the low level.

The above mentioned logic circuit 200 operates as a well known NOR circuit. Now, an operation of the logic circuit 200 will be described.

When a low level is inputted to each of the input terminals 21 and 23, the enhancement FET 2 and the enhancement FET 4 are turned off, so that the potential of the node 41 is elevated to the power supply voltage $V_{DD}$. At this time, the potential of the output terminal 22 is also elevated. However, by action of the high level output potential limiting circuit 10, after the potential of the output terminal 22 is elevated to a limited high level potential which is enough to turn on the drain-source channel of the input MES FET (not shown in FIG. 3) of the next stage logic circuit (not shown in FIG. 3) having a gate connected to the output terminal 22 but which is insufficient to turn on the gate-source of the same input MES FET, the potential of the output terminal 22 no longer elevates higher than the limited high level potential. Therefore, when the high level is outputted from the logic circuit 200, no current flows into the next stage circuit (not shown in FIG. 3).

When a high level is inputted to both or either of the input terminals 21 and 23, both the enhancement FETs 2 and 4 or only a corresponding one of the enhancements FETs 2 and 4 is turned on, so that the potential of the node 41 falls down to several 100 mV. Therefore, the high level output potential limiting circuit 10 is put in an OFF condition, namely, in an inoperable condition. ON the other hand, by action of both the low level potential lowering circuits 11 and 12 or a corresponding one of the low level potential lowering circuits 11 and 12, the potential of the output terminal 22 is quickly pulled down to the same potential as that of the second power supply terminal 32 ($V_{SS}$). Therefore, the input transistor (not shown in FIG. 3) of the next stage circuit (not shown in FIG. 3) is put in a complete OFF condition, so that the current of the next stage circuit (not shown in FIG. 3) in the OFF condition can be minimized.

Incidentally, the NOR circuit shown in FIG. 3 is of a two-input type. However, it would be a matter of course to persons skilled in the art that a NOR circuit having three or more inputs can be constituted by extending the NOR circuit shown in FIG. 3 in a similar construction.

Figure 4:
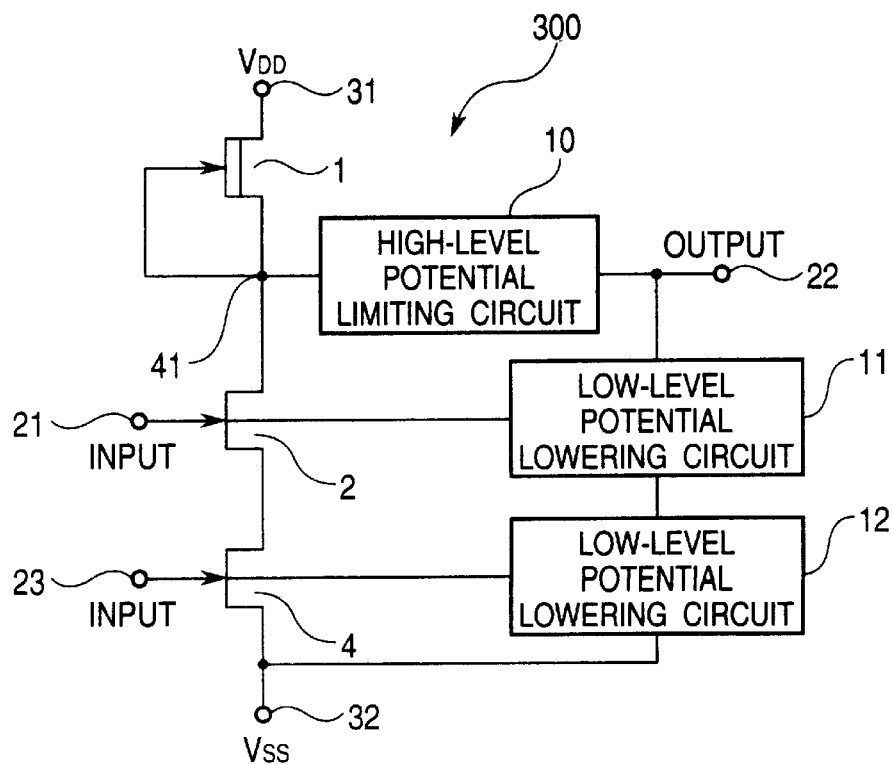
FIG. 4 is a block diagram illustrating a third conceptual embodiment of the logic circuit in accordance with the present invention.

Referring to FIG. 4, there is shown a block diagram illustrating a third conceptual embodiment of the logic circuit in accordance with the present invention.

As shown in FIG. 4, the logic circuit in accordance with the present invention is generally designated with reference numeral 300. In this logic circuit, the drain of the depletion FET 1 is connected to the first power supply terminal 31 (for example, $V_{DD}$), and the gate and the source of the depletion FET 1 is connected in common at the node 41 to the drain of the enhancement FET 2. The gate of the enhancement FET 2 is connected to the input terminal 21, and the source of the enhancement FET 2 is connected to a drain of another enhancement FET 4. The gate of the enhancement FET 4 is connected to the second input terminal 23, and the source of the enhancement FET 4 is connected to the second power supply terminal 32 (for example, $V_{SS}$).

The node 41 is elevated to the power supply voltage $V_{DD}$ when it is at a high level. This node 41 is connected to the output terminal 22 through the high level output potential limiting circuit 10 which acts to lower the high level potential on the output terminal 22, to a potential which is enough to turn on the drain-source channel of the input MES FET (not shown in FIG. 4) of the next stage logic circuit (not shown in FIG. 4) having a gate connected to the output terminal 22 but which is insufficient to turn on the gate-source of the same input MES FET.

Furthermore, the output terminal 22 is connected through the low level potential lowering circuits 11 and 12 to the second power supply terminal 32. Therefore, the low level potential lowering circuits 11 and 12 are connected in series between the output terminal 22 and the second power supply terminal 32. The low level potential lowering circuit 11 has the input connected to the input terminal 21, and the low level potential lowering circuit 12 has the input connected to the input terminal 23. When the output potential changes from the high level to the low level, the low level potential lowering circuits 11 and 12 cooperate to quickly and sufficiently pull down the potential of the output terminal 22 to the potential of the second power supply terminal 32.

The above mentioned logic circuit 300 operates as a well known NAND circuit. Now, an operation of the logic circuit 300 will be described.

When a low level is inputted to both or either of the input terminals 21 and 23 (namely, to at least one of the input terminals 21 and 23), both the enhancement FETs 2 and 4 or a corresponding one of the enhancement FETs 2 and 4 is turned off, so that the potential of the node 41 is elevated to the power supply voltage $V_{DD}$. At this time, the potential of the output terminal 22 is also elevated. However, by action of the high level output potential limiting circuit 10, after the potential of the output terminal 22 is elevated to a limited high level potential which is enough to turn on the drain-source channel of input MES FET (not shown in FIG. 4) of the next stage logic circuit (not shown in FIG. 4) having a gate connected to the output terminal 22 but which is insufficient to turn on the gate-source of the same input MES FET, the potential of the output terminal 22 no longer elevates higher than the limited high level potential. Therefore, when the high level is outputted from the logic circuit 300, no current flows into the next stage circuit (not shown in FIG. 4).

When a high level is inputted to both of the input terminals 21 and 23, both the enhancement FETs 2 and 4 are turned on, so that the potential of the node 41 falls down to several 100 mV. Therefore, the high level output potential limiting circuit 10 is put in an OFF condition namely, in an inoperable condition. On the other hand, by action of both the low level potential lowering circuits 11 and 12, the potential of the output terminal 22 is quickly pulled down to the same potential as that of the second power supply terminal 32 ($V_{SS}$). Therefore, the input transistor (not shown in FIG. 4) of the next stage circuit (not shown in FIG. 4) is put in a complete OFF condition, so that the current of the next stage circuit (not shown in FIG. 4) in the OFF condition can be minimized.

Incidentally, the NAND circuit shown in FIG. 4 is of a two-input type. However, it would be a matter of course to persons skilled in the art that a NAND circuit having three or more inputs can be constituted by extending the NAND circuit shown in FIG. 4 in a similar construction.

Figure 5:
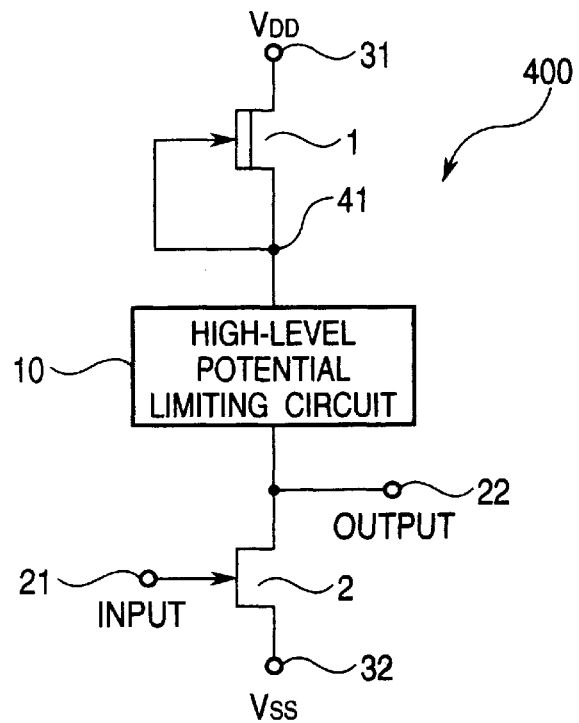
FIG. 5 is a block diagram illustrating a fourth conceptual embodiment of the logic circuit in accordance with the present invention.

Referring to FIG. 5, there is shown a block diagram illustrating a fourth conceptual embodiment of the logic circuit in accordance with the present invention.

As shown in FIG. 5, the logic circuit in accordance with the present invention is generally designated with reference numeral 400. In this logic circuit, the drain of the depletion FET 1 is connected to the first power supply terminal 31 (for example $V_{DD}$), and the gate and the source of the depletion FET 1 is connected in common at the node 41 to an input of the high level output potential limiting circuit 10. The drain of the enhancement FET 2 is connected to an output of the high level output potential limiting circuit 10, and also connected to the output terminal 22. The gate of this enhancement FET 2 is connected to the input terminal 21, and the source of the enhancement FET 2 is connected to the second power supply terminal 32 (for example, $V_{SS}$).

The node 41 is elevated to the power supply voltage $V_{DD}$ when it is at a high level. However, the high level output potential limiting circuit 10 having the input connected to the node 41, acts to lower the high level potential on the output terminal 22, to a potential which is enough to turn on the drain-source channel of the input MES FET (not shown in FIG. 5) of the next stage logic circuit (not shown in FIG. 5) having a gate connected to the output terminal 22 but which is insufficient to turn on the gate-source of the same input MES FET.

The above mentioned logic circuit 400 operates as a well known inverter. Now, an operation of the logic circuit 400 will be described.

When a low level is inputted to the input terminal 21, the enhancement FET 2 is turned off, so that the potential of the node 41 is elevated to the power supply voltage $V_{DD}$. At this time, the potential of the output terminal 22 is also elevated. However, by action of the high level output potential limiting circuit 10, after the potential of the output terminal 22 is elevated to a limited high level potential which is enough to turn on the drain-source channel of the input MES FET (not shown in FIG. 5) of the next stage logic circuit (not shown in FIG. 5) having a gate connected to the output terminal 22 but which is insufficient to turn on the gate-source of the same input MES FET, the potential of the output terminal 22 no longer elevates higher than the limited high level potential. Therefore, when the high level is outputted from the logic circuit 400, no current flows into the next stage circuit.

As mentioned above, in this logic circuit in accordance with the fourth conceptual embodiment of the present invention, when the output is at the high level, a wasteful current non-contributable to the operation is minimized. Therefore, a low power consumption logic circuit can be realized.

Figure 6:
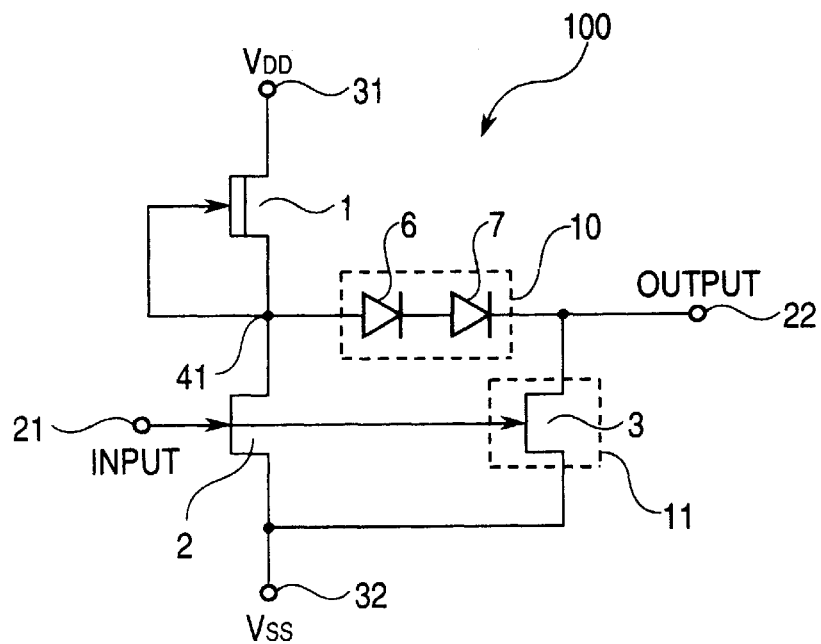
FIG. 6 is a circuit diagram illustrating a first embodiment of the logic circuit in accordance with the present invention.

Referring to FIG. 6, there is shown a circuit diagram illustrating a first embodiment of the logic circuit in accordance with the present invention, based on the first conceptual embodiment of the present invention.

As seen from comparison between FIG. 2 and FIG. 6, the high level output potential limiting circuit 10 shown in FIG. 2 is constituted of a series-connected diodes 6 and 7. An anode of the diode 6 is connected to the node 41, and a cathode of the diode 6 is connected to an anode of the diode 7. A cathode of the diode 7 is connected to the output terminal 22. On the other hand, the low level potential lowering circuit 11 shown in FIG. 2 is constituted of an enhancement FET 3, which has a gate connected to the input terminal 21, a drain connected to the output terminal 22, and a source connected to the second power supply terminal 32.

In the circuit shown in FIG. 6, even if the potential of the node 41 is elevated near to the power supply voltage $V_{DD}$, the potential of the output terminal 22 becomes lower than the power supply voltage $V_{DD}$ by a forward direction voltage drop of the two series-connected diodes 6 and 7. In this embodiment, the two diodes 6 and 7 are series-connected, but the number of series-connected diodes can be determined by the power supply voltage $V_{DD}$ and the voltage difference which should be stepped down by the series-connected diodes. Namely, assuming that the first power supply voltage is $V_{DD}$, the second power supply voltage is $V_{SS}$, the forward direction voltage drop of one diode is Vf, and the number of series-connected diodes is "n", the high level output potential $V_{OUT}$ on the output terminal 22 is expressed as follows:

$$V_{OUT}=(V_{DD}-V_{SS})-n\times Vf \qquad (1)$$

Accordingly, it is sufficient if the factor "n" in the above equation is determined to be enough to turn on the drain-source channel of the input MES FET of the next stage logic circuit having a gate connected to the output terminal 22 but to be insufficient to turn on the gate-source of the same input MES FET. Here, as a matter of course, "n" is a positive integer.

On the other hand, if the high level is applied to the input terminal 21, the enhancement FET 3 is turned on, so that the potential of the output terminal 22 which should be brought to the low level, is quickly pulled down by the turned-on enhancement FET 3.

In this embodiment, since the forward direction voltage drop of the diode(s) is utilized, even if the potential of the node 41 is elevated near to the power supply voltage $V_{DD}$, the potential of the output terminal 22 is limited to a potential which is lower than the power supply voltage $V_{DD}$ by the voltage corresponding to the number of the diodes.

With this arrangement, in the high level outputting condition, when the voltage equal to the power supply voltage $V_{DD}$ appears on the node 41, the high level potential limiting circuit 10 constituted of the series-connected diodes 6 and 7 outputs on the output terminal the potential which is enough to turn on the drain-source channel of the output MES FET of the next stage logic circuit having a gate connected to the output terminal 22 but is insufficient to turn on the gate-source of the same input MES FET. Thus, the current flowing from the output terminal 22 into the next stage logic circuit is prevented, so that the power consumption is reduced.

On the other hand, when the high level is applied to the input terminal 21, the enhancement FET 3 is turned on to quickly pull down the potential of the output terminal 22 which should be brought to the low level. Therefore, the potential of the output terminal 22 becomes perfectly consistent with the second power supply voltage $V_{SS}$, so that the input enhancement FET of the next stage logic circuit is put in a complete OFF condition, with the result that the power consumption can be minimized.

Figure 7:
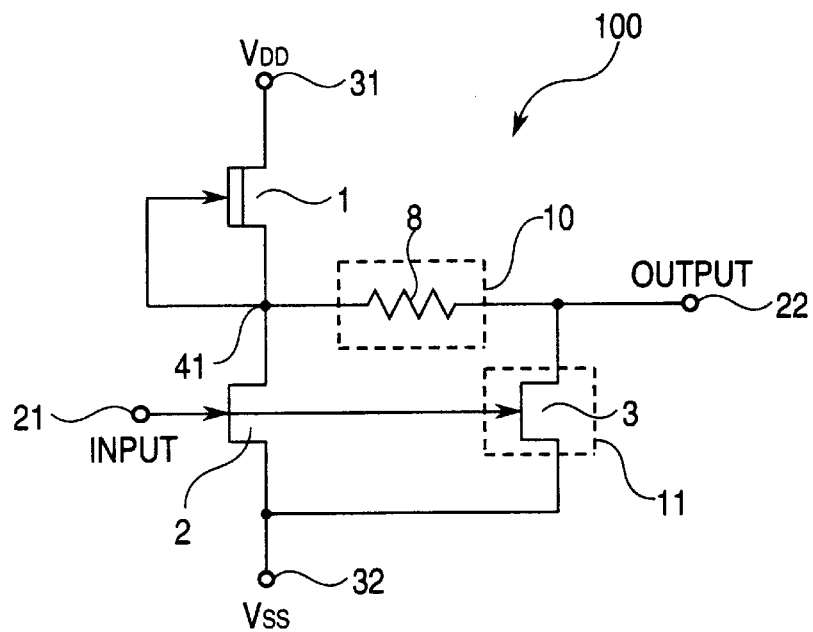
FIG. 7 is a circuit diagram illustrating a second embodiment of the logic circuit in accordance with the present invention.

Referring to FIG. 7, there is shown a circuit diagram illustrating a second embodiment of the logic circuit in accordance with the present invention, based on the first conceptual embodiment of the present invention.

As seen from comparison between FIG. 6 and FIG. 7, the second embodiment is different from the first embodiment only in that the high level output potential limiting circuit 10 is constituted of a resistor 8.

In this embodiment, even if the potential of the node 41 is elevated near to the power supply voltage $V_{DD}$, the potential of the output terminal 22 is lowered by a voltage drop occurring across the resistor 8. Namely, the potential of the output terminal 22 is lower than the potential of the node 41 by a product of a current flowing through a resistor 8 with a resistance of the resistor 8. Therefore, the resistance of the resistor 8 is determined so that a potential difference occurs between the potential of the output terminal 22 and the potential of the node 41 with a very small current flowing through the resistor.

Figure 8:
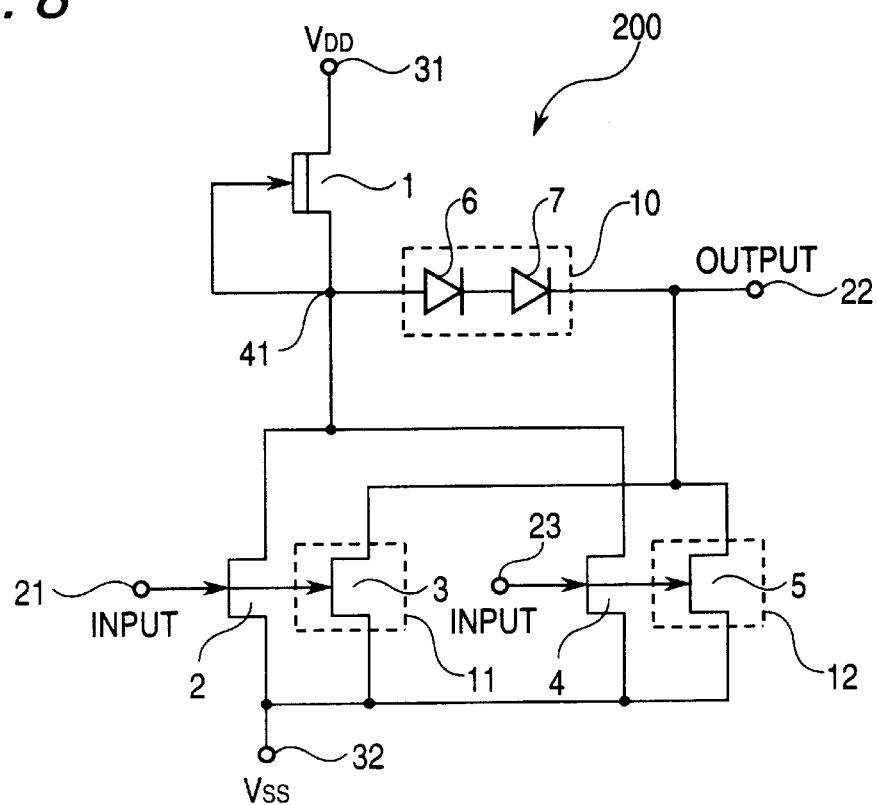
FIG. 8 is a circuit diagram illustrating a third embodiment of the logic circuit in accordance with the present invention.

Referring to FIG. 8, there is shown a circuit diagram illustrating a third embodiment of the logic circuit in accordance with the present invention, based on the second conceptual embodiment of the present invention.

As seen from comparison between FIG. 3 and FIG. 8, the high level output potential limiting circuit 10 shown in FIG. 3 is constituted of a series-connected diodes 6 and 7. An anode of the diode 6 is connected to the node 41, and a cathode of the diode 6 is connected to an anode of the diode 7. A cathode of the diode 7 is connected to the output terminal 22. On the other hand, the low level potential lowering circuit 11 shown in FIG. 3 is constituted of an enhancement FET 3, which has a gate connected to the input terminal 21, a drain connected to the output terminal 22, and a source connected to the second power supply terminal 32. The low level potential lowering circuit 12 shown in FIG. 3 is constituted of an enhancement FET 5, which has a gate connected to the input terminal 23, a drain connected to the output terminal 22, and a source connected to the second power supply terminal 32.

In the circuit shown in FIG. 8, even if the potential of the node 41 is elevated near to the power supply voltage $V_{DD}$, the potential of the output terminal 22 becomes lower than the power supply voltage $V_{DD}$ by a forward direction voltage drop of the two series-connected diodes 6 and 7. In this embodiment, the two diodes 6 and 7 are series-connected, but the number of series-connected diodes can be determined by the power supply voltage $V_{DD}$ and the voltage difference which should be stepped down by the series-connected diodes.

Similarly to the first embodiment, assuming that the first power supply voltage is $V_{DD}$, the second power supply voltage is $V_{SS}$, the forward direction voltage drop of the one diode is Vf, and the number of series-connected diodes is "n", the high level output potential $V_{OUT}$ on the output terminal 22 is expressed as follows:

$$V_{OUT}=(V_{DD}-V_{SS})-n \times Vf \tag{1}$$

Accordingly, it is sufficient if the factor "n" in the above equation is determined to be enough to turn on the drain-source channel of the input MES FET of the next stage logic circuit having a gate connected to the output terminal 22 but to be insufficient to turn on the gate-source of the same input MES FET.

On the other hand, if at least one of the input terminals 21 and 23 is brought to the high level, a corresponding one of the enhancement FETs 3 and 5 is turned on, so that the potential of the output terminal 22 which should be brought to the low level, is quickly pulled down by the turned-on enhancement FET 3 or 5.

Figure 9:
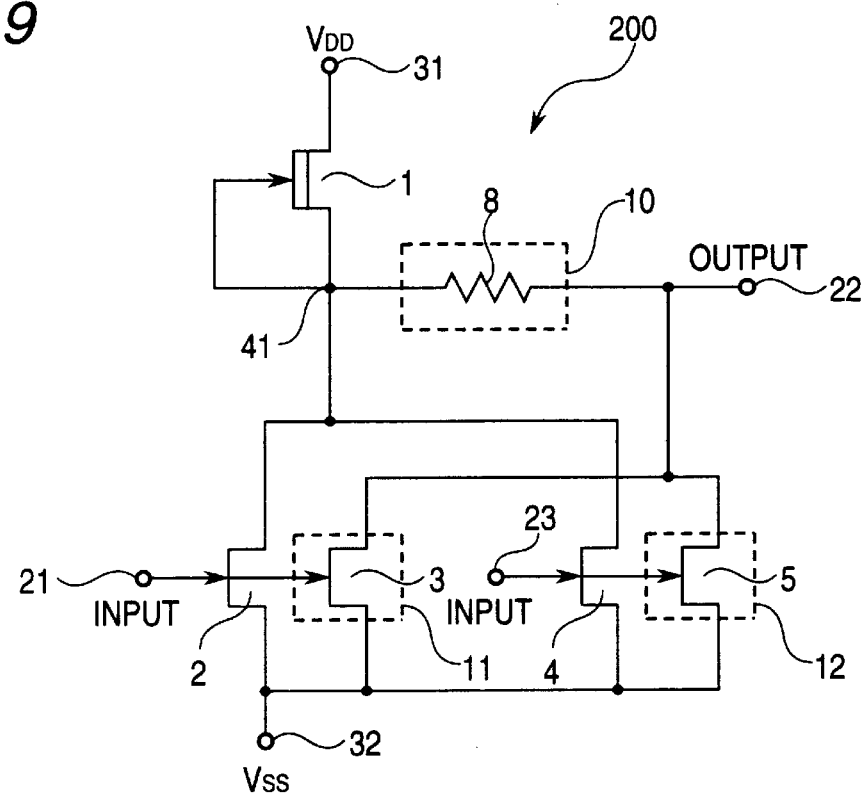
FIG. 9 is a circuit diagram illustrating a fourth embodiment of the logic circuit in accordance with the present invention.

Referring to FIG. 9, there is shown a circuit diagram illustrating a fourth embodiment of the logic circuit in accordance with the present invention, based on the second conceptual embodiment of the present invention.

As seen from comparison between FIG. 8 and FIG. 9, the fourth embodiment is different from the third embodiment only in that the high level output potential limiting circuit 10 is constituted of a resistor 8.

In this embodiment, even if the potential of the node 41 is elevated near to the power supply voltage $V_{DD}$, the potential of the output terminal 22 is lowered by a voltage drop occurring across the resistor 8. Namely, the potential of the output terminal 22 is lower than the potential of the node 41 by a product of a current flowing through a resistor 8 with a resistance of the resistor 8. Therefore, the resistance of the resistor 8 is determined so that a potential difference occurs between the potential of the output terminal 22 and the potential of the node 41 with a very small current flowing through the resistor.

Figure 10:
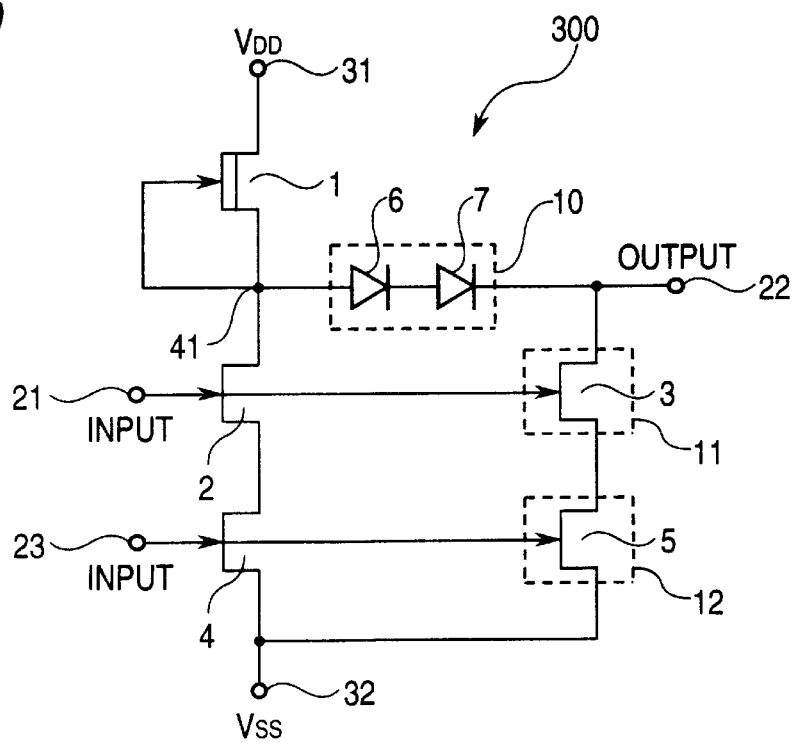
FIG. 10 is a circuit diagram illustrating a fifth embodiment of the logic circuit in accordance with the present invention.

Referring to FIG. 10, there is shown a circuit diagram illustrating a fifth embodiment of the logic circuit in accordance with the present invention, based on the third conceptual embodiment of the present invention.

As seen from comparison between FIG. 4 and FIG. 10, the high level output potential limiting circuit 10 shown in FIG. 4 is constituted of a series-connected diodes 6 and 7. An anode of the diode 6 is connected to the node 41, and a cathode of the diode 6 is connected to an anode of the diode 7. A cathode of the diode 7 is connected to the output terminal 22. On the other hand, the low level potential lowering circuit 11 shown in FIG. 4 is constituted of an enhancement FET 3, which has a gate connected to the input terminal 21, a drain connected to the output terminal 22. The low level potential lowering circuit 12 shown in FIG. 3 is constituted of an enhancement FET 5, which has a gate connected to the input terminal 23, a drain connected to a source of the enhancement FET 3, and a source connected to the second power supply terminal 32.

In the circuit shown in FIG. 10, even if the potential of the node 41 is elevated near to the power supply voltage $V_{DD}$, the potential of the output terminal 22 becomes lower than the power supply voltage $V_{DD}$ by a forward direction voltage drop of the two series-connected diodes 6 and 7. In this embodiment, the two diodes 6 and 7 are series-connected, but the number of series-connected diodes is in no way limited to two. The number of series-connected diodes can be determined by the power supply voltage $V_{DD}$ and the voltage difference which should be stepped down by the series-connected diodes.

Similarly to the first embodiment, assuming that the first power supply voltage is $V_{DD}$, the second power supply voltage is $V_{SS}$, the forward direction voltage drop of one diode is Vf, and the number of series-connected diodes is "n", the high level output potential $V_{OUT}$ on the output terminal 22 is expressed as follows:

$$V_{OUT} = (V_{DD} - V_{SS}) - n \times Vf \quad (3)$$

Accordingly, it is sufficient if the factor "n" in the above equation is determined to be enough to turn on the drain-source channel of the input MES FET of the next stage logic circuit having a gate connected to the output terminal 22 but to be insufficient to turn on the gate-source of the same input MES FET.

On the other hand, if both of the input terminals 21 and 23 are brought to the high level, both of the enhancement FETs 3 and 5 are turned on, so that the potential of the output terminal 22 which should be brought to the low level, is quickly pulled down by the turned-on enhancement FETs 3 and 5.

Figure 11:
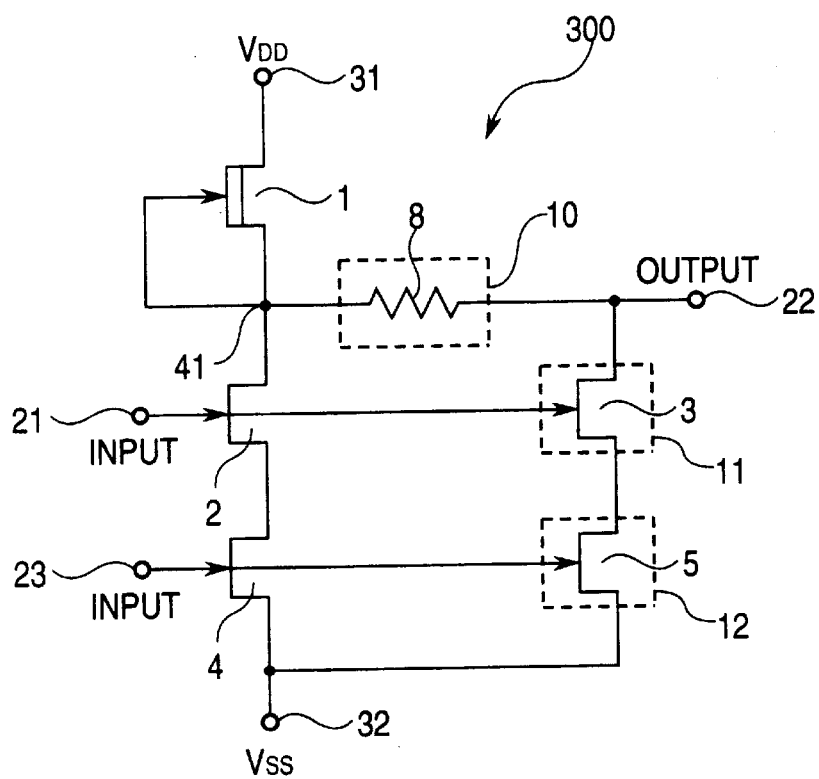
FIG. 11 is a circuit diagram illustrating a sixth embodiment of the logic circuit in accordance with the present invention.

Referring to FIG. 11, there is shown a circuit diagram illustrating a sixth embodiment of the logic circuit in accordance with the present invention, based on the third conceptual embodiment of the present invention.

As seen from comparison between FIG. 10 and FIG. 11, the sixth embodiment is different from the fifth embodiment only in that the high level output potential limiting circuit 10 is constituted of a resistor 8.

In this embodiment, even if the potential of the node 41 is elevated near to the power supply voltage $V_{DD}$, the potential of the output terminal 22 is lowered by a voltage drop occurring across the resistor 8. Namely, the potential of the output terminal 22 is lower than the potential of the node 41 by a product of a current flowing through a resistor 8 with a resistance of the resistor 8. Therefore, the resistance of the resistor 8 is determined so that a potential difference occurs between the potential of the output terminal 22 and the potential of the node 41 with a very small current flowing through the resistor.

Figure 12:
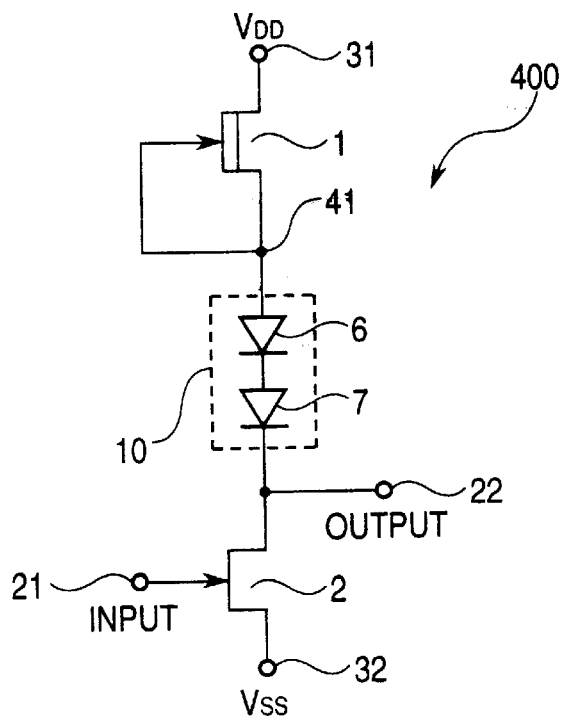
FIG. 12 is a circuit diagram illustrating a seventh embodiment of the logic circuit in accordance with the present invention.

Referring to FIG. 12, there is shown a circuit diagram illustrating a seventh embodiment of the logic circuit in accordance with the present invention, based on the fourth conceptual embodiment of the present invention.

As seen from comparison between FIG. 5 and FIG. 12, the high level output potential limiting circuit 10 shown in FIG. 5 is constituted of a series-connected diodes 6 and 7. An anode of the diode 6 is connected to the node 41, and a cathode of the diode 6 is connected to an anode of the diode 7. A cathode of the diode 7 is connected to the output terminal 22.

In the circuit shown in FIG. 12, even if the potential of the node 41 is elevated near to the power supply voltage $V_{DD}$, the potential of the output terminal 22 becomes lower than the power supply voltage $V_{DD}$ by a forward direction voltage drop of the two series-connected diodes 6 and 7. In this embodiment, the two diodes 6 and 7 are series-connected, but the number of series-connected diodes is in no way limited to two. The number of series-connected diodes can be determined by the power supply voltage $V_{DD}$ and the voltage difference which should be stepped down by the series-connected diodes.

Similarly, to the first embodiment, assuming that the first power supply voltage is $V_{DD}$, the second power supply voltage is $V_{SS}$, the forward direction voltage drop of one diode is Vf, and the number of series-connected diodes is "n", the high level output potential $V_{OUT}$ on the output terminal 22 is expressed as follows:

$$V_{OUT} = (V_{DD} - V_{SS}) - n \times Vf \quad (4)$$

Accordingly, it is sufficient if the factor "n" in the above equation is determined to be enough to turn on the drain-source channel of the input MES FET of the next stage logic circuit having a gate connected to the output terminal 22 but to be insufficient to turn on the gate-source of the same input MES FET.

In this embodiment, since the forward direction voltage drop of the diode(s) is utilized, even if the potential of the node 41 is elevated near to the power supply voltage $V_{DD}$, the potential of the output terminal 22 is limited to a potential which is lower than the power supply voltage $V_{DD}$ by the voltage corresponding to the number of the diodes.

With this arrangement, in the high level outputting condition, when the voltage equal to the power supply voltage $V_{DD}$ appears on the node 41, the high level potential limiting circuit 10 constituted of the series-connected diodes 6 and 7 outputs on the output terminal the potential which is enough to turn on the drain-source channel of the input MES FET of the next stage logic circuit having a gate connected to the output terminal 22 but is insufficient to turn on the gate-source of the same input MES FET. Thus, the current flowing from the output terminal 22 into the next stage logic circuit is prevented, so that the power consumption is reduced.

In this embodiment, the high level output potential limiting circuit 10 is constituted of the series-connected diodes 6 and 7, but can be constituted of a resistor, similarly to the second, fourth and sixth embodiments.

As mentioned above, according to the present invention, when the low level is outputted, the high level potential limiting circuit is put in an OFF condition, namely, in an inoperable condition, and the lower level lowering circuit is put in an ON condition, namely, in an operating condition, so that the low level potential on the output terminal is pulled down to the second power supply voltage, with the result that the input transistor of the next stage field effect transistor logic circuit is put in a complete OFF condition. Accordingly, the current flowing through the input FET of the next stage field effect transistor logic circuit in the OFF condition can be prevented, so that the power consumption can be minimized.

On the other hand, when the high level is outputted, by action of the high level potential limiting circuit, the high level potential on the output terminal is elevated only to the potential which turns on the drain-source channel of the input MES FET of the next stage field effect transistor logic circuit, but which never turns on the gate-source of the input MES FET of the next stage field effect transistor logic circuit. Therefore, no current flows into the next stage field effect transistor logic circuit, so that a current non-contributable to the operation is minimized, and therefore, the power consumption is minimized.

The invention has thus been shown and described with reference to the specific embodiments. However, it should be noted that the present invention is in no way limited to the details of the illustrated structures but changes and modifications may be made within the scope of the appended claims.

What is claimed is:

1. A field effect transistor logic circuit having an output terminal to be connected to a gate of an input field transistor in a next stage field effect transistor logic circuit, the field effect transistor logic circuit including a depletion transistor having a drain connected to a first power supply voltage, an enhancement transistor having a drain connected at a node to a source of the depletion transistor, a gate of said enhancement transistor being connected to an input terminal, a source of said enhancement transistor being connected to a second power supply voltage which is lower than the first power supply voltage, and a high level potential limiting circuit connected between said node and said output terminal, for lowering a potential of said output terminal to a level which turns on a drain-source channel of said input field effect transistor of said next stage field effect transistor logic circuit but which never turns on a gate-source of said input field effect transistor of said next stage field effect transistor logic circuit, when the potential on said node is at a high level and a lower level lowering circuit connected between said output terminal and said second power supply voltage, and having an input connected to said input terminal, for pulling down the potential of said output terminal to the potential of the second power supply voltage when the potential on said node is at a low level.

2. A field effect transistor logic circuit claimed in claim 1 wherein said high level potential limiting circuit includes "n" series-connected diodes connected between said node and said output terminal, where "n" is a positive integer.

3. A field effect transistor logic circuit claimed in claim 1 wherein said lower level lowering circuit includes an enhancement field effect transistor having a gate connected to said input terminal, a drain connected to said output terminal and a source connected to said power supply voltage.

4. A field effect transistor logic circuit claimed in claim 1 wherein said high level potential limiting circuit includes a resistor connected between said node and said output terminal.

5. A field effect transistor logic circuit claimed in claim 4 further including a lower level lowering circuit connected between said output terminal and said second power supply voltage, and having an input connected to said input terminal, for pulling down the potential of said output terminal to the potential of the second power supply voltage when the potential on said node is at a lower level.

6. A field effect transistor logic circuit claimed in claim 5 wherein said lower level lowering circuit includes an enhancement field effect transistor having a gate connected to said input terminal, a drain connected to said output terminal and a source connected to said second power supply voltage.

7. A field effect transistor logic circuit claimed in claim 1 further including a lower level lowering circuit connected between said output terminal and second power supply voltage, and having an input connected to said input terminal, for pulling down the potential of said output terminal to the potential of the second power supply voltage when the potential on said node is at a low level.

8. A field effect transistor logic circuit claimed in claim 7 wherein said lower level lowering circuit includes an enhancement field effect transistor having a gate connected to said input terminal, a drain connected to said output terminal and a source connected to said second power supply voltage.

9. A field effect transistor logic circuit claimed in claim 7 further including a second enhancement field effect transistor having a gate connected to a second input terminal, a drain connected to said node and a source connected to said second power supply voltage, so that a NOR circuit is constituted, and a second lower level lowering circuit connected between said output terminal and said second power supply voltage, and having an input connected to said second input terminal, for pulling down the potential on said output terminal to the potential of the second power supply voltage when the potential on said node is at a low level.

10. A field effect transistor logic circuit claimed in claim 7 further including a second enhancement field effect transistor having a gate connected to a second input terminal, and inserted between the first mentioned enhancement field effect transistor and said second power supply voltage in such a manner that a drain of said second enhancements field effect transistor is connected to the source of the first mentioned enhancement field effect transistor and a source of said second enhancement field effect transistor is connected to said second power supply voltage, so that a NAND circuit is constituted, and a second lower lever-lowering circuit having an input connected to said second input terminal, and connected between the first mentioned lower level lowering circuit and said second power supply voltage, so that the first mentioned lower level lowering circuit and said second lower level lowering circuit cooperate to pull down the potential of said output terminal to the potential of the second power supply voltage when the potential on said node is at a low level.

* * * * *